(12) United States Patent
Carter et al.

(10) Patent No.: US 8,653,605 B2
(45) Date of Patent: Feb. 18, 2014

(54) WORK FUNCTION ADJUSTMENT IN A HIGH-K GATE ELECTRODE STRUCTURE AFTER TRANSISTOR FABRICATION BY USING LANTHANUM

(71) Applicants: Richard Carter, Dresden (DE); Sven Beyer, Dresden (DE); Joachim Metzger, Butzbach (DE); Robert Binder, Dresden (DE)

(72) Inventors: Richard Carter, Dresden (DE); Sven Beyer, Dresden (DE); Joachim Metzger, Butzbach (DE); Robert Binder, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/689,992

(22) Filed: Nov. 30, 2012

(65) Prior Publication Data

US 2014/0015058 A1    Jan. 16, 2014

Related U.S. Application Data

(62) Division of application No. 12/691,192, filed on Jan. 21, 2010, now Pat. No. 8,343,837.

(30) Foreign Application Priority Data

Jan. 30, 2009 (DE) .......................... 10 2009 006 802

(51) Int. Cl.
  *H01L 21/70* (2006.01)
  *H01L 27/088* (2006.01)

(52) U.S. Cl.
  USPC ..... 257/369; 257/392; 257/407; 257/E29.159

(58) Field of Classification Search
  USPC .......................................... 257/407, E29.159
  See application file for complete search history.

(56) References Cited

U.S. PATENT DOCUMENTS

| | | | |
|---|---|---|---|
| 7,651,935 B2 * | 1/2010 | Adetutu et al. | 438/585 |
| 2005/0233527 A1 | 10/2005 | Brask et al. | 438/287 |
| 2006/0022277 A1 | 2/2006 | Kavalieros et al. | 257/369 |
| 2007/0037343 A1 | 2/2007 | Colombo et al. | 438/231 |
| 2009/0101984 A1 * | 4/2009 | Lee et al. | 257/369 |
| 2009/0212371 A1 * | 8/2009 | Kobayashi | 257/369 |
| 2010/0052066 A1 * | 3/2010 | Yu et al. | 257/369 |
| 2010/0052071 A1 * | 3/2010 | Niimi et al. | 257/369 |
| 2010/0127336 A1 * | 5/2010 | Chambers et al. | 257/369 |
| 2010/0176454 A1 * | 7/2010 | Hooker | 257/369 |

OTHER PUBLICATIONS

Translation of Official Communication from German Patent Office for German Patent Application No. 10 2009 006 802.3-33 dated Aug. 11, 2009.

* cited by examiner

*Primary Examiner* — Daniel Luke
(74) *Attorney, Agent, or Firm* — Amerson Law Firm, PLLC

(57) ABSTRACT

The work function of a high-k gate electrode structure may be adjusted in a late manufacturing stage on the basis of a lanthanum species in an N-channel transistor, thereby obtaining the desired high work function in combination with a typical conductive barrier material, such as titanium nitride. For this purpose, in some illustrative embodiments, the lanthanum species may be formed directly on the previously provided metal-containing electrode material, while an efficient barrier material may be provided in the P-channel transistor, thereby avoiding undue interaction of the lanthanum species in the P-channel transistor.

6 Claims, 6 Drawing Sheets

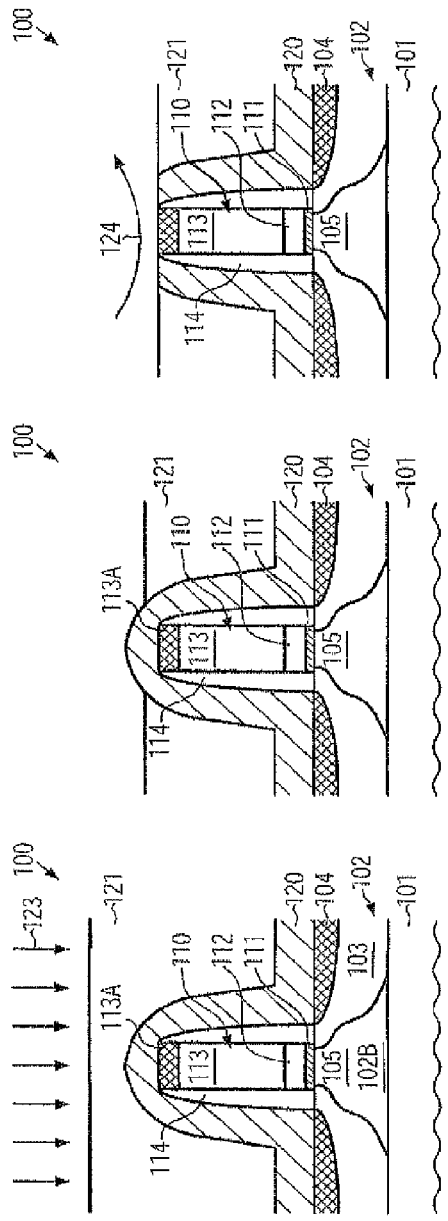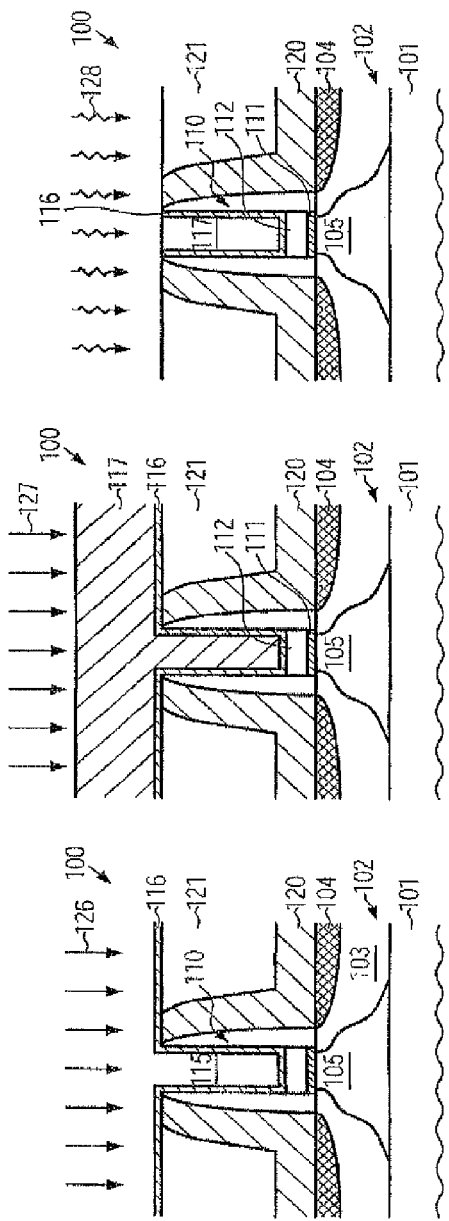

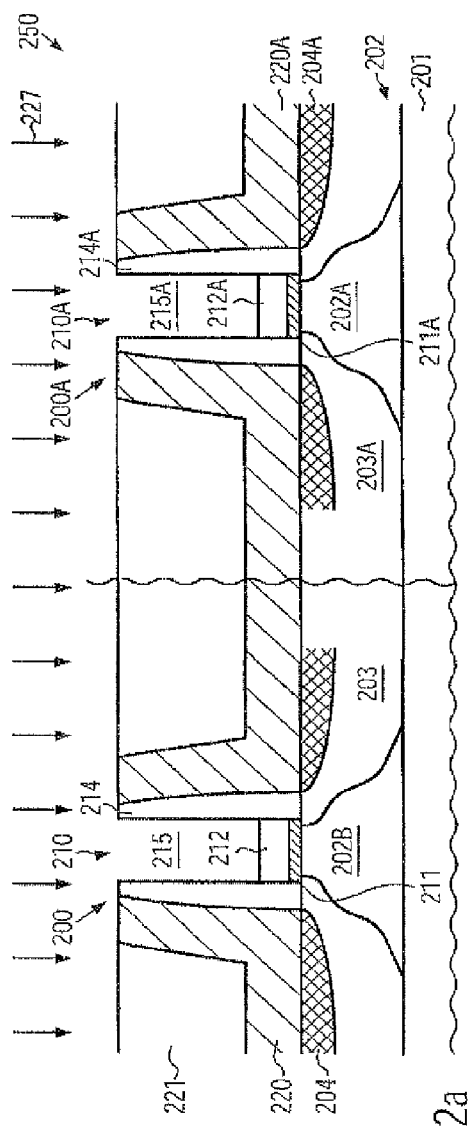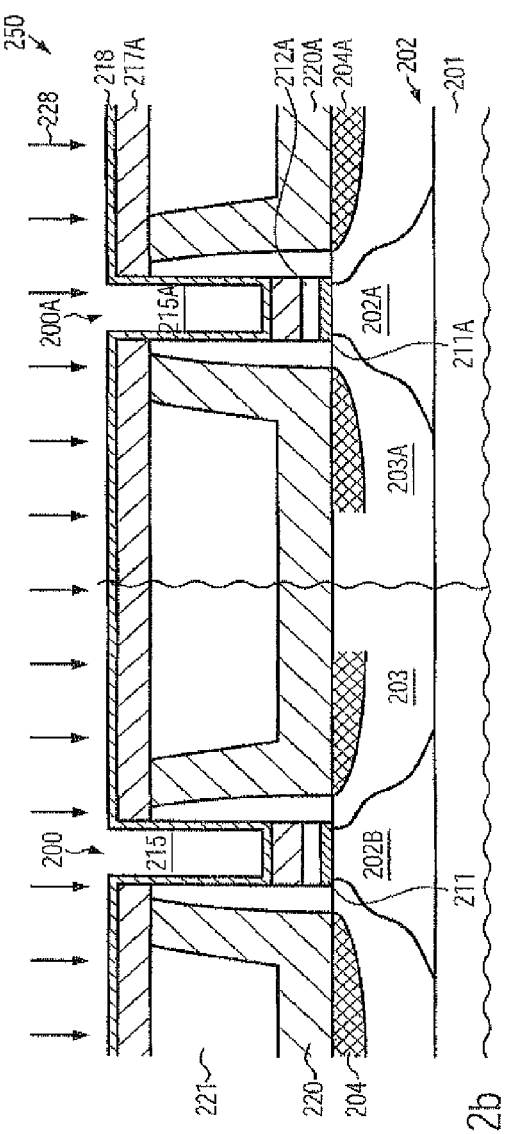

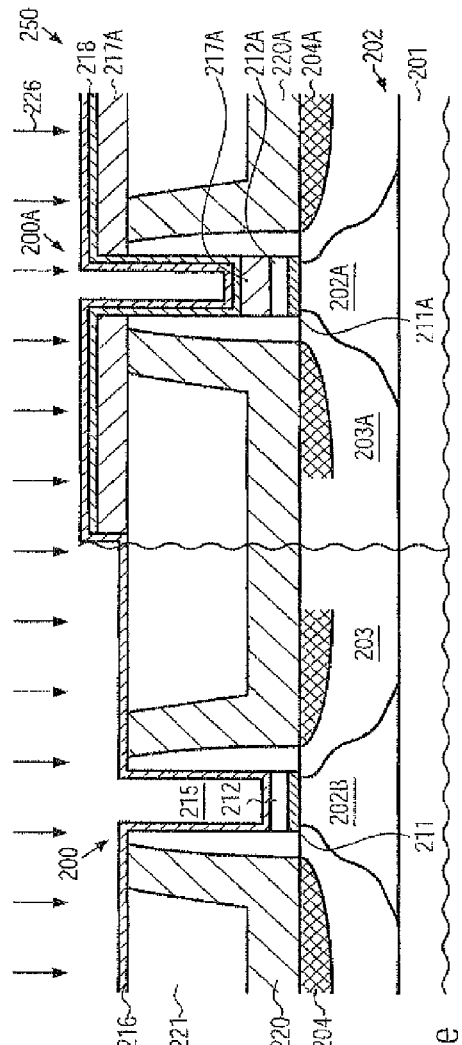
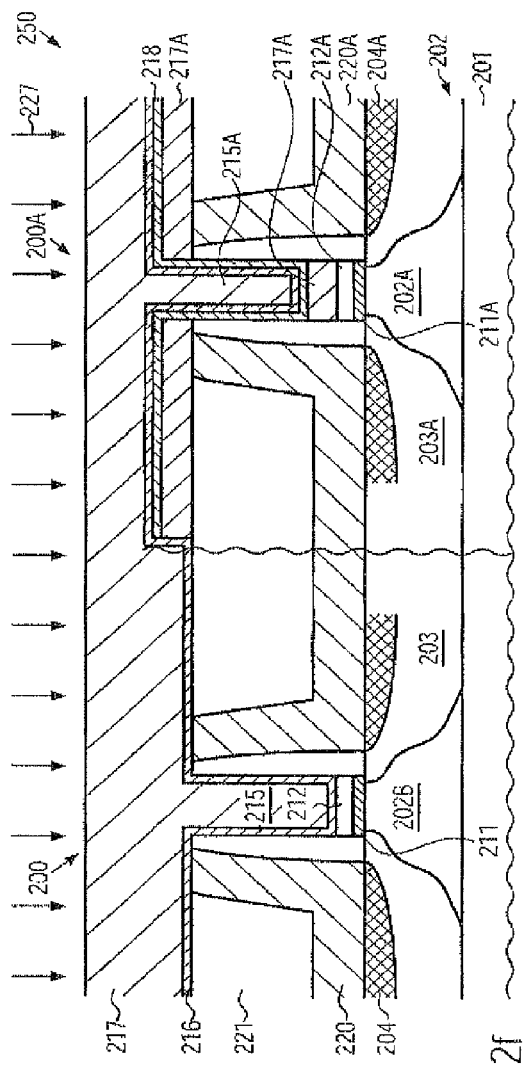
FIG. 2e
FIG. 2f

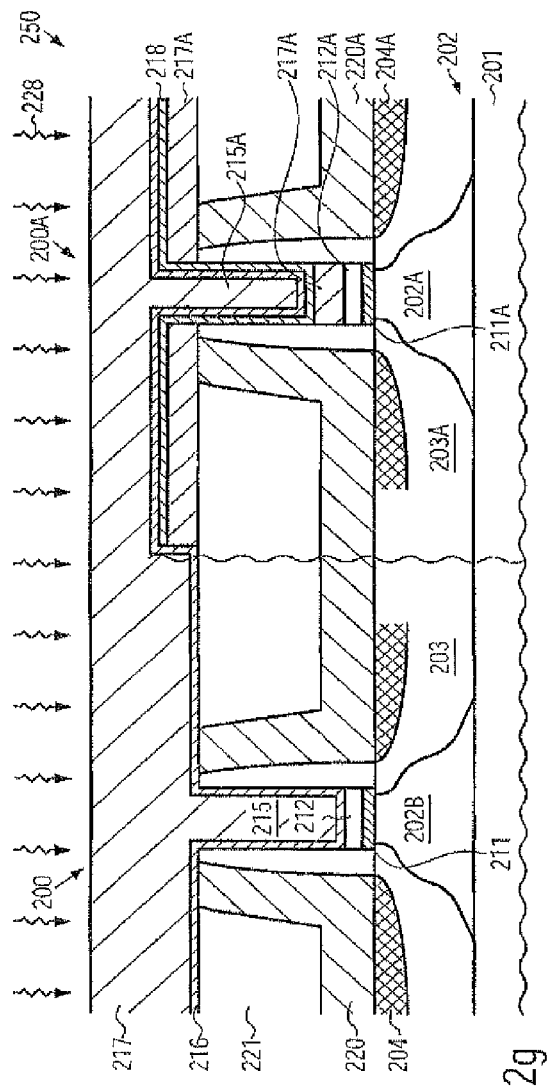
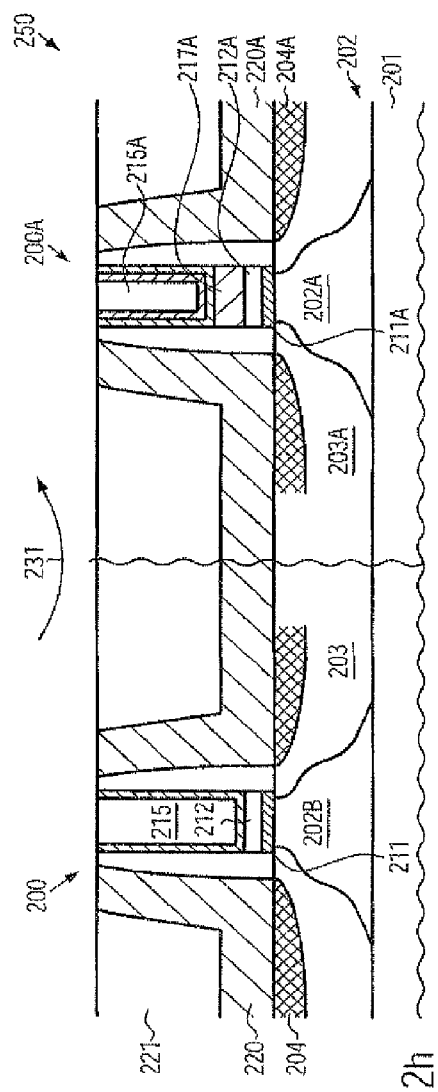

WORK FUNCTION ADJUSTMENT IN A HIGH-K GATE ELECTRODE STRUCTURE AFTER TRANSISTOR FABRICATION BY USING LANTHANUM

CROSS-REFERENCE TO RELATED APPLICATION

This is a divisional of co-pending application Ser. No. 12/691,192, filed Jan. 21, 2010.

BACKGROUND OF THE INVENTION

1. Field of the Invention

Generally, the present disclosure relates to the sophisticated integrated circuits including transistor elements comprising highly capacitive gate structures on the basis of a metal-containing electrode material and a high-k gate dielectric of increased permittivity compared to conventional gate dielectrics, such as silicon dioxide and silicon nitride.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and increase of gate resistivity, is a dominant design criterion for accomplishing an increase in the operating speed of the integrated circuits.

Presently, the vast majority of integrated circuits are based on silicon due to substantially unlimited availability, the well-understood characteristics of silicon and related materials and processes and the experience gathered during the last 50 years. Therefore, silicon will likely remain the material of choice for future circuit generations designed for mass products. One reason for the dominant importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a gate insulation layer that separates the gate electrode, frequently comprised of polysilicon or other metal-containing materials, from the silicon channel region. In steadily improving device performance of field effect transistors, the length of the channel region has continuously been decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a dependence of the threshold voltage on the channel length. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 0.08 µm may require a gate dielectric made of silicon dioxide as thin as approximately 1.2 nm. Although, generally, high speed transistor elements having an extremely short channel may preferably be used for high speed applications, whereas transistor elements with a longer channel may be used for less critical applications, such as storage transistor elements, the leakage current caused by direct tunneling of charge carriers through an ultra-thin silicon dioxide gate insulation layer may reach values for an oxide thickness in the range of 1-2 nm that may not be compatible with thermal design power requirements for performance driven circuits.

Therefore, replacing silicon dioxide as the material for gate insulation layers has been considered, particularly for extremely thin silicon dioxide gate layers. Possible alternative materials include materials that exhibit a significantly higher permittivity so that a physically greater thickness of a correspondingly formed gate insulation layer provides a capacitive coupling that would be obtained by an extremely thin silicon dioxide layer. Therefore, it has thus been suggested to replace silicon dioxide with high permittivity materials, such as tantalum oxide ($Ta_2O_5$) with a k of approximately 25, strontium titanium oxide ($SrTiO_3$) having a k of approximately 150, hafnium oxide ($HfO_2$), HfSiO, zirconium oxide ($ZrO_2$) and the like.

Additionally, transistor performance may be increased by providing an appropriate conductive material for the gate electrode to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance based on the same thickness as a silicon dioxide layer, while additionally maintaining leakage currents at an acceptable level. On the other hand, the non-polysilicon material, such as titanium nitride and the like, may be formed so as to connect to the high-k dielectric material, thereby substantially avoiding the presence of a depletion zone. Since, typically, a low threshold voltage of the transistor, which represents the voltage at which a conductive channel forms in the channel region, is desired to obtain the high drive currents, commonly, the controllability of the respective channel requires pronounced lateral dopant profiles and dopant gradients, at least in the vicinity of the PN junctions. Therefore, so-called halo regions are usually formed by ion implantation in order to introduce a dopant species whose conductivity type corresponds to the conductivity type of the remaining channel and semiconductor region to "reinforce" the resulting PN junction dopant gradient after the formation of respective extension and deep drain and source regions. In this way, the threshold voltage of the transistor significantly determines the controllability of the channel, wherein a significant variance of the threshold voltage may be observed for reduced gate lengths. Hence, by providing an appropriate halo implantation region, the controllability of the channel may be enhanced, thereby also reducing the variance of the threshold voltage, which is also referred to as threshold roll-off, and also reducing significant variations of transistor performance with a variation in gate length.

On the other hand, the threshold voltage depends, in addition to the specific transistor configuration as described above, strongly on the work function of the gate electrode structure, which may be appropriately adjusted to the conductivity type and also to specific transistor characteristics, such as gate length and the like. The adaptation of the work function of the metal-containing electrode material may typically be accomplished by providing specific metal or metal alloys to obtain the required work function. It turns out, however, that presently the number of promising material candidates for adjusting the work function of sophisticated transistor elements may be moderately low, in particular when handling of these metals has to accomplished in very sophisticated manufacturing processes for fabricating semiconductor devices in accordance with volume production techniques. For example, titanium and aluminum, as well as any alloys thereof, may be used as gate electrode materials which, however, may specifically be adapted in material composition and the like to obtain the required work function and thus threshold adjustment. For example, in particular for sophisticated N-channel transistors, a moderately high work function of approximately 4.1 electron volts may be difficult to achieve since typically the work function has to be adjusted on the basis of an appropriate conductive barrier material that may have to be provided to guarantee integrity of the high-k dielectric material according to conventional process strategies. That is, according to a plurality of conventional process strategies, the high-k dielectric material may be provided in an early manufacturing stage and may thus pass through a plurality of process steps, such as a plurality of etch steps, high temperature treatments and the like, to complete the basic transistor configuration. Thereafter, in some of these approaches, a corresponding placeholder material, such as polysilicon, may be replaced by the desired metal electrode material, wherein, however, as previously explained, an appropriate material composition may have to be provided to obtain in combination with a conductive barrier layer, which may have to be maintained throughout the preceding process steps, the desired work function. For example, titanium nitride may frequently be used as a conductive barrier material which, however, may not readily allow a high work function as may be required for sophisticated N-channel transistors. On the other hand, avoiding the conductive barrier layer during the preceding process steps may be less than desirable due to a significant material erosion of the sensitive high-k dielectric material. Similarly, a removal of the conductive cap layer prior to the deposition of the work function metal may not represent a very promising approach due to a corresponding significant erosion of the high-k dielectric material.

In other conventional approaches, the high-k dielectric material and an appropriate work function metal for N-channel transistors may be provided in an early manufacturing stage and may then be patterned to obtain high-k gate electrode structures. In this case, however, a very complex manufacturing sequence may be required for maintaining the desired characteristics of the work function metal since frequently a significant drift may be observed after any high temperature processes. Additionally, the band gap of the channel material of P-channel transistors may be specifically adapted to the work function metal, which may frequently be accomplished on the basis of a silicon/germanium material, which may locally be provided within the channel region of the P-channel transistors. Consequently, a very complex process sequence prior to patterning the high-k metal gate electrodes may have to be performed which, in combination with a high probability of shifting the characteristics of the work function metal, may result in reduced performance of sophisticated semiconductor devices, which may render this approach, i.e., providing the high-k metal gate structure in an early manufacturing stage, a less attractive approach.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and methods in which work function and thus the transistor threshold voltage may be adjusted on the basis of an appropriate metal species, which may be selectively provided for N-channel transistors in a very advanced manufacturing stage without unduly affecting the work function of the gate electrodes of P-channel transistors. In some illustrative aspects disclosed herein, the work function adjusting species for the N-channel transistors may be comprised of a lanthanum which may enable, in combination with an appropriate metal-containing electrode material acting as a conductive barrier material, such as titanium nitride, aluminum oxide and the like, a desired high work function for N-channel transistors. In other illustrative aspects disclosed herein, a highly efficient manufacturing sequence may be provided in which the selective adjustment of the work function may be accomplished without unduly contributing to overall process complexity, for instance in terms of additional lithography steps and the like, thereby providing superior production yield due to the reduced process complexity, while at the same time threshold adjustment of N-channel transistors, such as short channel transistors and long channel transistors within the same semiconductor device, may be accomplished in a highly efficient manner on the basis of an appropriate work function adjusting species, such as lanthanum.

One illustrative method disclosed herein comprises forming a gate electrode structure of a transistor above a semiconductor layer, wherein the gate electrode structure comprises a placeholder electrode material formed above a high-k gate insulation layer. The method further comprises forming drain and source regions of the transistor and removing the placeholder electrode material. Furthermore, a lanthanum-containing material layer is formed above the high-k gate insulation layer. Finally, the method comprises forming a metal-containing electrode material on the lanthanum-containing material layer.

A further illustrative method disclosed herein comprises removing a placeholder material of a first gate electrode structure of a first transistor and of a second gate electrode structure of a second transistor so as to expose a metal-containing material formed on a high-k gate insulation layer of the first and second gate electrode structures, wherein the first and second transistors have different conductivity types. The method further comprises forming a work function adjusting material on the metal-containing material selectively in the first gate electrode structure. Furthermore, a first metal layer is formed on the work function adjusting material and a second metal layer is formed on the metal-containing material of the second gate electrode structure wherein the second metal layer defines a work function of the second gate electrode structure in combination with the metal-containing material.

One illustrative semiconductor device disclosed herein comprises a first gate electrode structure of a first transistor. The first gate electrode structure comprises a high-k gate insulation material, a metal-containing material formed on the high-k gate insulation material, a work function adjusting material formed on the metal-containing material and a metal-containing electrode material. Additionally, the semiconductor device comprises a second gate electrode structure of a second transistor wherein the second gate electrode structure comprises the high-k gate insulation material, the metal-containing material formed on the high-k gate insulation material, a first metal material, a conductive barrier material formed on the first metal material, the work function adjusting material positioned above the conductive barrier material and a second metal material.

BRIEF DESCRIPTION OF THE DRAWINGS

The disclosure may be understood by reference to the following description taken in conjunction with the accompanying drawings, in which like reference numerals identify like elements, and in which:

FIGS. 1a-1f schematically illustrate cross-sectional views of an N-channel transistor during various manufacturing stages in replacing a placeholder electrode material of a gate electrode structure in a very advanced manufacturing stage and adjusting the work function on the basis of a lanthanum species, according to illustrative embodiments; and FIGS. 2a-2i schematically illustrate cross-sectional views of a semiconductor device during various manufacturing stages for forming transistors of different conductivity type on the basis of a sophisticated gate electrode structure, in which the work function and thus a threshold adjustment may be performed after completing the basic transistor configuration, according to illustrative embodiments.

Figure 2C:
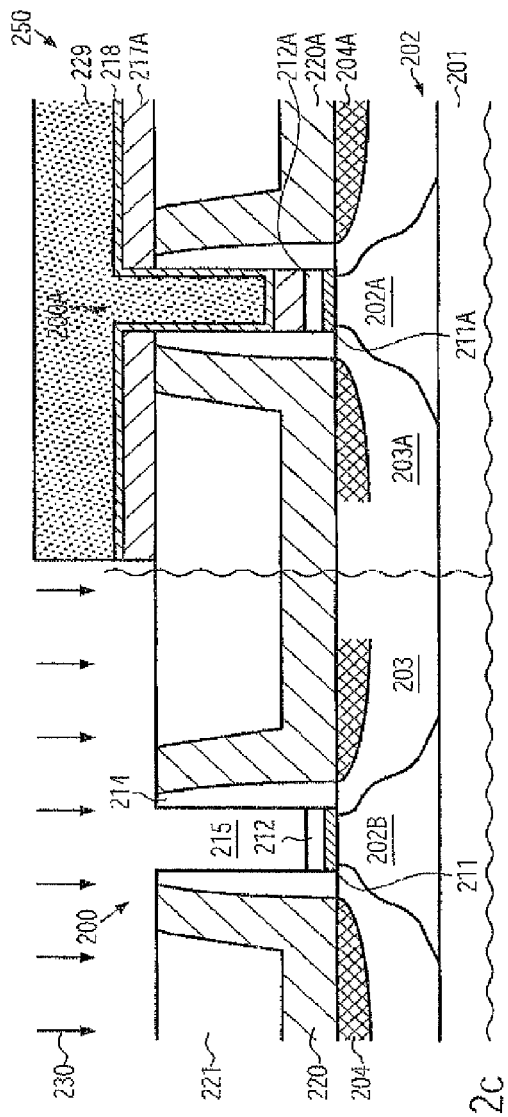

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein provides enhanced techniques and devices wherein sophisticated high-k gate stacks may be formed after completing the basic transistor structure, thereby reducing the probability of high threshold characteristics of sophisticated transistors compared to conventional strategies in which work function adjusting metals may be provided in an early manufacturing stage. Furthermore, in some illustrative embodiments, a lanthanum species may be incorporated into work function metal selectively in N-channel transistors, thereby providing the possibility of obtaining a desired high work function in combination with corresponding metal-containing materials, such as titanium nitride, aluminum oxide and the like, which may be provided to maintain integrity of the sensitive high-k gate dielectric material throughout the preceding manufacturing processes. As will be described later on in more detail, in some illustrative embodiments, the lanthanum species may be provided on the basis of a highly efficient manufacturing strategy without requiring additional lithography steps compared to conventional process techniques, in which the work function may be adjusted in a late manufacturing stage for P-channel transistors and N-channel transistors. For this purpose, in some illustrative embodiments, the lanthanum species may be provided after forming a work function metal selectively for the P-channel transistor and maintaining the work function adjusting characteristics thereof on the basis of an appropriate conductive barrier material, such as titanium nitride, thereby also providing an efficient diffusion barrier for the lanthanum material to be deposited in a subsequent manufacturing stage. As a consequence, a very efficient overall manufacturing process may be provided for enabling the adjustment of the work function for different configurations of N-channel transistors since sophisticated patterning regimes for appropriately providing specific titanium/aluminum alloys for the different N-channel transistor configurations may be avoided.

FIG. 1a schematically illustrates a field effect transistor 100 in a very advanced manufacturing stage. That is, the transistor 100 may comprise a substrate 101, which may represent any appropriate carrier material, such as a silicon-based material, an insulating carrier material and the like, above which may be formed an appropriate semiconductor layer 102, such as a silicon-based layer or any other appropriate material including any species for adjusting the desired overall electronic characteristics of the material 102. It should be appreciated that the substrate 101 in combination with the semiconductor layer 102 may form, at least locally within the substrate 101, a silicon-on-insulator (SOI) configuration when a corresponding buried insulating layer (not shown) is provided so as to "vertically" separate the semiconductor layer 102 from the substrate 101. In a portion or active region of the semiconductor layer 102, indicated as 102B, an appropriate dopant profile may be established so as to obtain drain and source regions 103 of the transistor 100 wherein, as previously discussed, the corresponding dopant profile may have any appropriate configuration so as to adjust the overall transistor characteristics, such as drive current, threshold voltage and the like. It should be appreciated, however, that at least the threshold voltage adjustment may be completed in a later manufacturing stage, as will be described later on. Furthermore, if required, metal silicide regions 104 may be formed in the drain and source regions in order to reduce the overall series resistance of a conductive path formed by the drain and source regions 103 and a channel region 105 laterally positioned between the drain and source regions 103.

The transistor further comprises a gate electrode structure 110, which may comprise a high-k gate insulation layer 111, which may thus comprise at least one material composition having a dielectric constant of approximately 10.0 or higher. It should be appreciated that the term "high-k gate insulation layer or gate dielectric material" may also include any material composition in which also conventional dielectric materials, such as silicon dioxide, silicon nitride and the like having a relative permittivity of less than 10.0, may be present. For instance, in some embodiments, an oxide layer such as a native oxide and the like may be formed on the channel region followed by a high-k dielectric material, for instance one of the materials as previously referred to. Moreover, the high-k gate insulation layer 111 may be covered by a metal-containing material 112 which may also act as a barrier material for maintaining integrity of the high-k gate insulation layer 111 during manufacturing processes for forming the transistor 100, as illustrated in FIG. 1a. In addition, the metal-containing material 112 may provide superior conductivity compared to, for instance, doped polysilicon material, which may represent a well-established gate electrode material. Thus, due to the moderately high conductivity of the material 112, a corresponding generation of a depletion zone, as may typically occur in polysilicon gate electrodes, may be avoided so that, in combination with the enhanced conductivity, superior performance of the transistor 100 may be accomplished. As previously explained, the metal-containing material may have to provide an appropriate work function to adjust the finally desired threshold voltage of the transistor 100, which may be accomplished by incorporating appropriate species in a later manufacturing stage. For example, the metal-containing material may be provided in the form of a titanium nitride material, aluminum oxide and the like. Additionally, the gate electrode structure 110 may comprise a dummy or placeholder electrode material 113, such as a silicon material and the like, which may, therefore, provide a high degree of compatibility with well-established manufacturing techniques.

Furthermore, the gate electrode structure 110 may comprise a spacer structure 114, which may have any appropriate configuration to provide gate integrity during the preceding manufacturing processes and also provide appropriate conditions during any implantation processes for defining the drain and source regions 103 on the basis of an implantation. It should be appreciated that the configuration of the spacer structure 114 may thus change during the entire process sequence for forming the transistor 100, depending on the specific requirements of each of the various manufacturing stages. For example, the sidewall spacer structure 114 may comprise an appropriate liner material, such as a silicon nitride material, which may be formed on sidewalls of the placeholder material 113 and in particular on sidewalls of the high-k gate insulation layer 111 to maintain overall integrity of this material. Furthermore, the placeholder material 113 may also comprise a metal silicide 113A, depending on the process strategy used.

Furthermore, a dielectric layer 120 may be formed above the drain and source regions 103 and the gate electrode structure 110, which may be provided in the form of any appropriate material. For example, in sophisticated applications, the dielectric material 120 may comprise a high internal stress level which may be transferred into the channel region 105, thereby generating a specific type of strain therein, which in turn may enhance the overall charge carrier mobility and thus conductivity of the channel region 105. For example, the dielectric layer 120 may be provided in the form of a silicon nitride material which may have a tensile stress component, and which may be advantageous for enhancing performance of N-channel transistors for a standard crystallographic configuration of the active region 102B. In this respect, it should be understood that a standard crystallographic configuration is to be understood as a silicon-based semiconductor material having a (100) surface orientation while the transistor length direction, i.e., in FIG. 1a the horizontal direction, is aligned to a <110> crystallographic axis. It should be appreciated, however, that any other appropriate crystallographic orientation may be used, if considered appropriate for the transistor 100. Furthermore, a further dielectric material 121, such as a silicon dioxide material, may be formed above the dielectric layer 120 wherein also in this case any other appropriate material may be used, depending on the overall process and device requirements. Typically, the material 121 may represent a portion of an interlayer dielectric material that may be provided to maintain integrity of the transistor 100 and provide a "platform" for the formation of further metallization levels as may be required for connecting a plurality of circuit elements, such as the transistor 100.

The transistor 100 as illustrated inure FIG. 1a may be formed on the basis of well-established process techniques for forming advanced transistor elements. For example, after defining the active region 102B, for instance on the basis of providing appropriate isolation structures (not shown) and establishing a desired basic dopant profile, the gate electrode structure 110 may be formed, for instance by providing an appropriate dielectric base layer, such as a silicon dioxide material, if desired, followed by the deposition of the high-k gate insulation layer 111, which may be accomplished on the basis of chemical vapor deposition (CVD) techniques and the like. Thereafter, the metal-containing material 112 may be formed, for instance, by sputter deposition, CVD and the like. Next, the placeholder material 113 may be deposited, for instance, on the basis of low pressure CVD, thereby forming material such as silicon material in an amorphous state. Thereafter, highly sophisticated patterning techniques including appropriate lithography processes may be performed to pattern the previously formed layer stack to obtain the gate electrode structure 110, which may have an appropriate gate length, i.e., in FIG. 1a the horizontal extension of the metal-containing material 112. For example, the length of the gate electrode structure 110 may be selected to be approximately 50 nm and less in sophisticated semiconductor devices. Thereafter, a portion of the spacer structure 114, for instance in the form of a nitride liner, may be provided to ensure integrity of the material 111 during the further processing. Next, the drain and source regions 103 may be formed in combination with appropriately selected configurations of the spacer structure 114 so as to obtain a desired complex dopant profile, as previously described. Thereafter, corresponding anneal processes may be performed in order to activate the dopants and re-crystallize implantation-induced damage. It should be appreciated that a plurality of additional process steps may be required, for instance complex masking steps for forming the drain and source regions 103 for different types of transistors, a plurality of cleaning steps and the like, during which integrity of the material 111 may be maintained by the metal-containing material 112 and the spacer structure 114. Subsequently, the metal silicide regions 104, possibly in combination with the region 113A, may be formed by well-established silicidation techniques, followed by a deposition of the material 120, which may be accomplished by plasma enhanced CVD techniques. Next, the dielectric material 121 may be deposited, for instance on the basis of plasma enhanced CVD, thermally activated CVD and the like. Thereafter, as illustrated in FIG. 1a, a material removal process 123 may be performed to remove any excess material of the layer 121, thereby exposing at least an upper portion of the layer 120. The removal process 123 may comprise selective etch recipes, chemical mechanical polishing (CMP) and the like.

FIG. 1b schematically illustrates the transistor 100 after the removal process 123 of FIG. 1a, thereby exposing an upper portion of the dielectric layer 120.

FIG. 1c schematically illustrates the transistor 100 when exposed to a further material removal process 124, which may represent, for instance, a selective etch process for selectively etching material of the Layer 120 with respect to the dielectric material 121. For this purpose, a plurality of well-established etch chemistries are available. In other cases, the process 124 may also include a mechanical removal component, for instance on the basis of CMP and the like. Thus, the gate electrode structure 110 may be exposed during the removal process 124. Thereafter, a further material removal process may be performed to selectively remove the placeholder material 113, which may be accomplished on the basis of chlorine-based etch chemistry, while, in other cases, highly selective wet chemical etch recipes may be used. For example, an etch chemistry on the basis of tetra methyl ammonium hydroxide (TMAH) may be used in an appropriate concentration and temperature so that a moderately high etch rate may be obtained for silicon material, while a high degree of selectivity with respect to silicon nitride, silicon dioxide and the like may be provided by this etch chemistry. Moreover, during the corresponding etch process, the metal-containing material 112 may act as an efficient etch stop layer, thereby ensuring integrity of the high-k gate insulation layer 111.

FIG. 1d schematically illustrates the transistor 100 in a further advanced manufacturing stage in which a work function adjusting material layer 116 may be formed on sidewalls of an opening 115 formed in the gate electrode structure 110 after the removal of the placeholder material, as described above. In one illustrative embodiment, the layer 116 may comprise a lanthanum species that may, in combination with metal-containing material 112, provide a desired high work function, for instance of approximately 4.0 electron volts and higher, so as to enable an appropriate adjustment of the threshold voltage of the transistor 100. For this purpose, any appropriate deposition process 126 may be performed, for instance, a sputter deposition process, a CVD process, an atomic layer deposition (ALD) process and the like. For example, the layer 116 may be provided with a thickness of approximately 1-25 Å, as required for appropriately adjusting the finally desired work function, which may be accomplished during a heat treatment during a later manufacturing stage.

FIG. 1e schematically illustrates the transistor 100 in a manufacturing stage in which an appropriate metal material 117 may be deposited on the basis of any appropriate deposition process 127 so as to fill the opening 115 (FIG. 1d). For example, any appropriate metal-containing material may be used for the layer 117, depending on the overall process requirements. Similarly, any appropriate deposition technique may be used during the process 127, such as CVD, sputter deposition, electroless plating and the like. Thereafter, any excess material of the layer 117 may be removed, for instance, by electrochemical etching, electro CMP, CMP and the like, wherein residues of the work function adjusting material 116 may also be removed from horizontal portions of the transistor 100.

FIG. 1f schematically illustrates the transistor 100 in a further advanced manufacturing stage in which the transistor 100 may be subjected to a heat treatment 128 in order to initiate the incorporation of a work function adjusting species of the layer 116 into the metal-containing material 112 so as to obtain the desired work function. For example, the heat treatment 128 may be performed at elevated temperatures of approximately 400-600° C., thereby "reflowing" the layer 116 so as to achieve a certain degree of diffusion into the layer 112. For example, the lanthanum species may be incorporated with a certain degree, depending on the initial thickness of the layer 116 and the process parameters of the treatment 128. Thus, in this manner, a desired high work function for the transistor 100 and thus the corresponding threshold voltage may be adjusted, for instance on the basis of lanthanum, thereby enabling the formation of sophisticated N-channel transistors, such as short channel transistors and the like.

With reference to FIGS. 2a-2I, further illustrative embodiments will now be described in which efficient overall manufacturing sequence may be accomplished by providing an appropriate work function adjusting species for N-channel transistors, such as a lanthanum species, without unduly affecting the work function adjustment of P-channel transistors.

FIG. 2a schematically illustrates a cross-sectional view of a semiconductor device 250 comprising a first transistor 200 and a second transistor 200A in a very advanced manufacturing stage. In one illustrative embodiment, the first transistor 200 may represent an N-channel transistor while the transistor 200A may represent a P-channel transistor. Furthermore, the transistors may have basically a configuration as previously described with reference to the transistor 100, wherein it should be appreciated that the transistors 200, 200A may differ from each other in their conductivity type and thus in the corresponding dopant profiles and dopant material. For convenience, any such differences are not shown in FIG. 2a. Thus, the transistors 200, 200A may comprise respective gate electrode structures 210, 210A, respectively, which may thus include a high-k gate insulation layer 211, 211A, a metal-containing material 212, 212A, which may also act as a conductive barrier or cap layer for the layers 211, 211A. Furthermore, a sidewall spacer structure 214, 214A may be provided. It should be appreciated that, in some illustrative embodiments, the components of the gate electrode structures 210, 210A may be identical due to a common manufacturing sequence, while, in other cases, if required, at least some of these components may be different in the transistors 200, 200A. Furthermore, in the manufacturing stage shown, respective openings 215, 215A are provided within the corresponding gate electrode structures 210, 210A, respectively.

Similarly, the transistors 200, 200A may comprise respective active regions 202B, 202A formed in a semiconductor layer 202, which may be provided above a substrate 201. Furthermore, corresponding drain and source regions 203, 203A, possibly in combination with metal silicide regions 204, 204A, may be provided in the active regions 202B, 202A. With respect to any of these components, the same criteria may apply as previously explained with reference to the transistor 100.

Furthermore, the semiconductor device 250 may be formed on the basis of similar process techniques as discussed above. It should be appreciated, however, that, due to the different conductivity type, a corresponding masking regime may be used for introducing appropriate doping species into the active regions 202B, 202A. Thus, after completing the basic transistor configuration of the device 250, one or more dielectric layers 220, 220A may be formed, for instance in the form of stressed dielectric materials, to establish a desired type of strain in the transistors 200, 200A. For example, a tensile stress component may be provided for the transistor 200, while a compressive stress component may be used in the layer 220A. For this purpose, well-established process techniques may be applied to selectively form the layer 220 above the transistor 200 and the layer 220A above the transistor 200A. It should be appreciated, however, that any other appropriate process regime may be applied if different stress components may not be required. Thereafter, the dielectric material 221 may be deposited and may be reduced in thickness so as to expose upper portions of the gate electrode structures 210, 210A, as previously explained. Next, an etch process 227, for instance on the basis of etch chemistries as discussed above, may be performed to obtain corresponding openings 215, 215A in the gate electrode structures 210, 210A, thereby exposing the metal-containing materials 212, 212A.

FIG. 2b schematically illustrates the semiconductor device 250 during a deposition sequence 228, in which a metal material 217A may be deposited, which may appropriately be selected so as to define a work function for the transistor 200A in combination with the remaining portion of the material 212A. For this purpose, any appropriate metal-containing material may be used, such as aluminum, titanium and the like. For this purpose, any appropriate deposition technique may be applied, for instance sputter deposition, in which a high degree of directionality may be achieved, thereby reliably forming material on the metal-containing material 212A within the opening 215A. It should be appreciated that the material 217A may be deposited within the opening 215. Thereafter, the deposition sequence 228 may comprise a further deposition step in which a conductive barrier material 218, such as titanium nitride and the like, may be deposited with an appropriate thickness, such as one to several nanometers, in order to provide sufficient diffusion hindering capabilities during the subsequent processing. For this purpose, any appropriate deposition technique may be used.

FIG. 2c schematically illustrates the semiconductor device 250 in a manufacturing stage in which the transistor 200A may be masked by an etch mask 229, such as a resist mask, while the transistor 200 is exposed to an etch ambient 230 that may be established on the basis of an etch chemistry for removing the materials of a layer 218 and 217A selectively with respect to the dielectric materials 221, 220 and the spacer structure 214. For example, a plurality of wet chemical and plasma assisted etch recipes are available for removing metal material selectively to dielectric materials, such as silicon nitride, silicon dioxide and the like. During the process 230, the conductive barrier material 218 may be removed first and subsequently an appropriate etch chemistry may be used for removing the material 217A from the transistor 200, wherein, at a final stage of the etch process 230, the material 212 may act as an etch stop or etch control material, thereby maintaining integrity of the underlying high-k gate insulation layer 211.

Figure 2D:
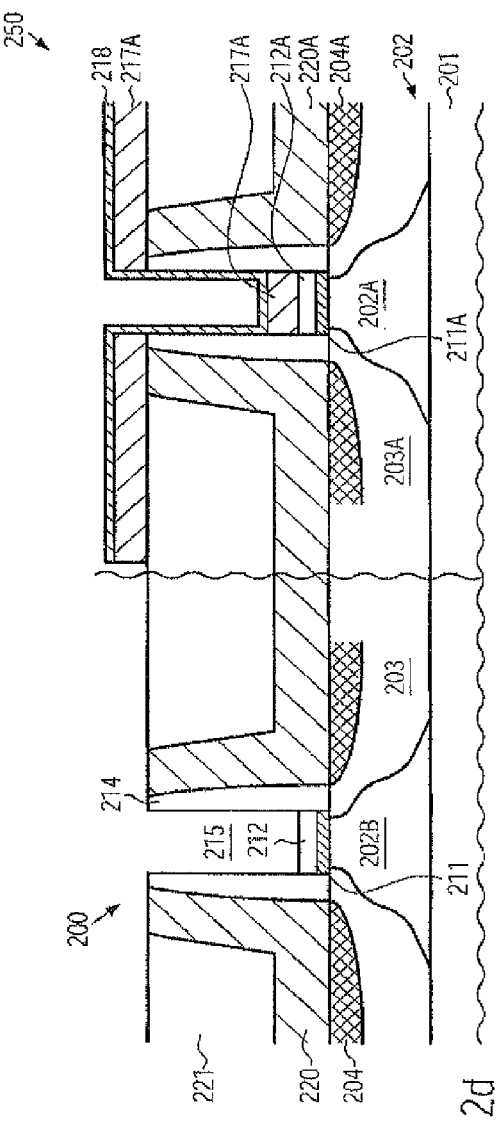

FIG. 2d schematically illustrates the semiconductor device 250 after removal of the etch mask 229 (FIG. 2c). The device 250 may be appropriately prepared for receiving a work function adjusting species for the transistor 200, wherein the conductive barrier material 218 may represent an appropriate barrier in the transistor 200A, thereby avoiding undue interaction of the work function adjusting species with the underlying material 217A, which may thus maintain its work function, thereby also maintaining the required threshold voltage for the transistor 200A.

FIG. 2e schematically illustrates the semiconductor device 250 when exposed to a deposition process 226, during which a work function adjusting species, such as a lanthanum-comprising material layer 216, may be deposited above the transistors 200, 200A. Consequently, during the process 226, the material 216 may be formed on the metal-containing material 212, while, in the transistor 200A, the material 216 may be formed on the conductive barrier material 218, thereby separating the work function metal 217A from the work function adjusting layer 216. With respect to the deposition process 226, the same criteria may apply as previously explained with reference to the deposition process 126 as illustrated in FIG. 1d. Furthermore, as discussed above, a thickness of the layer 216 may be selected in a range of approximately 1-25 Å.

FIG. 2f schematically illustrates the semiconductor device 250 during a further metal deposition process 227, during which an appropriate metal 217 may be formed so as to fill the openings 215, 215A. For this purpose, any appropriate material may be used since the work function for the transistor 200 may be adjusted on the basis of the layer 216 in combination with the metal-containing material 212, while, in the transistor 200A, the work function may be determined by the material 212A in combination with the metal 217A, which may be reliably separated from the materials 216 and 217 by the conductive barrier material 218. The deposition process 227 may be performed on the basis of any appropriate deposition technique, as is also discussed above with reference to the deposition process 127 as illustrated in FIG. 1e.

FIG. 2g schematically illustrates the semiconductor device 250 in a further advanced manufacturing stage. In this embodiment, a heat treatment 228 may be performed to initiate the incorporation of a species of the layer 216 in the material 212, as is also previously explained with reference to the transistor 100 when referring to the heat treatment 128, as illustrated in FIG. 1f. It should be appreciated that the heat treatment 228 may be performed prior to the removal of any excess material of the layer 217, as illustrated in FIG. 2g, while, in other cases, the corresponding heat treatment may be performed after removing any excess material, as is for instance explained with reference to the transistor 100. Similarly, for the transistor 100, a corresponding heat treatment 218 (FIG. 1f) may be performed prior to removing any excess material. Consequently, based on the characteristics of the layer 216, such as the material composition, the thickness thereof and the like, in combination with the process parameters of the process 228, the degree of interaction between the materials 216 and 212 may be adjusted, thereby also adjusting the work function and thus the threshold voltage of the transistor 200. As previously explained, the layer 216 may be provided in the form of a lanthanum layer or may have incorporated therein a moderately high concentration of lanthanum, thereby obtaining the desired high work function as may be required for sophisticated N-channel transistors, as discussed above.

FIG. 2h schematically illustrates the semiconductor device 250 during a material removal process 231, during which excess material of the layers 217, 216, 217A and 218 (FIG. 2g) may be removed. For this purpose, any appropriate process technique, either individually or in combination, may be applied, such as CMP, electro CMP, etching, electro etching and the like.

Figure 2I:
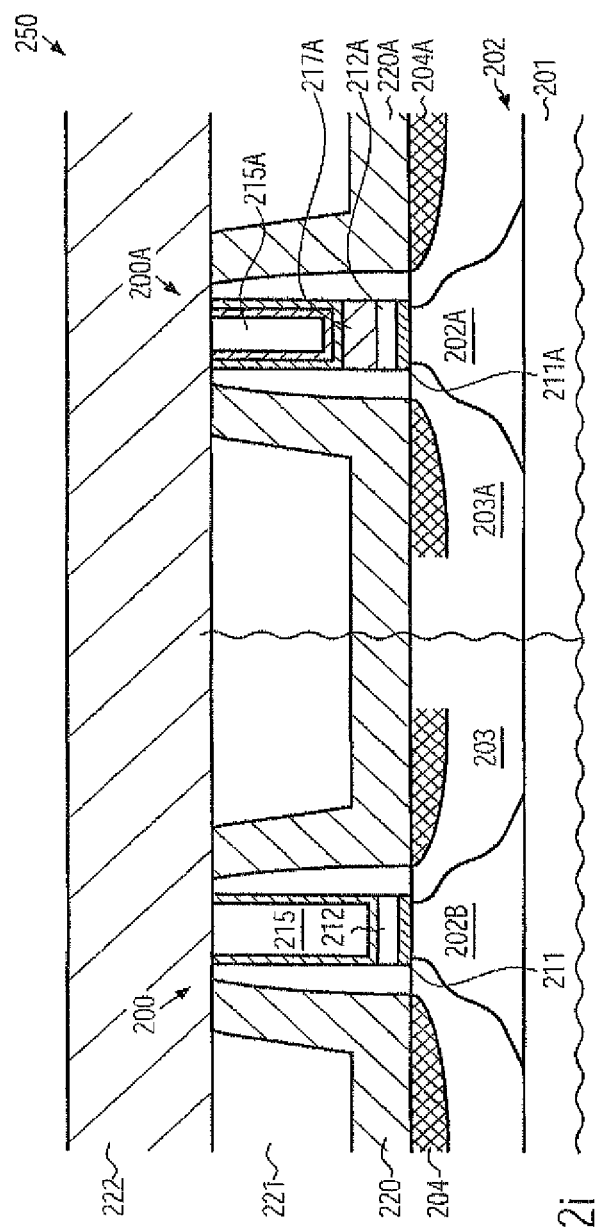

FIG. 2i schematically illustrates the semiconductor device 250 after providing a further interlayer dielectric material 222, for instance in the form of silicon dioxide and the like, which may be provided by any appropriate deposition process, such as plasma enhanced CVD, thermally activated CVD and the like. Thereafter, the further processing may be continued by forming appropriate contact openings in the materials 222, 221, 220 and 220A in order to form a contact to respective contact areas of the transistors 200, 200A. The corresponding process sequence may be performed on the basis of any well-established process techniques.

As a result, the present disclosure provides semiconductor devices and manufacturing techniques in which the work function and thus the threshold voltage of sophisticated transistors, such as N-channel transistors of different configuration, may be adjusted in a late manufacturing stage on the basis of a highly efficient overall manufacturing sequence. For this purpose, in some illustrative embodiments, a lanthanum species may be incorporated so as to initiate a material inter diffusion for adjusting the work function of one type of transistor while substantially suppressing an inter diffusion of the lanthanum species in the other type of transistor, which may be accomplished by selectively providing an appropriate conductive barrier material. Using the lanthanum species as a work function adjusting species may therefore enable obtaining moderately high work functions, as may be required for N-channel transistors, thereby contributing to enhanced transistor performance and increased production yield, since the efficient overall manufacturing flow may significantly reduce any process-related defects, which may typically be associated with highly complex process regimes for adjusting the work function of N-channel transistors of different configuration, such as short channel transistors and long channel transistors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A semiconductor device, comprising:
 a first gate electrode structure of a first transistor, said first gate electrode structure comprising a high-k gate insulation material, a metal-containing material formed on said high-k gate insulation material, a work function adjusting material formed on said metal-containing material and a metal-containing electrode material; and
 a second gate electrode structure of a second transistor, said second gate electrode structure comprising said high-k gate insulation material, said metal-containing material formed on said high-k gate insulation material, a first metal material, a conductive barrier material formed on said first metal material, said work function adjusting material formed above said conductive barrier material and a second metal material.

2. The semiconductor device of claim 1, wherein said work function adjusting material comprises lanthanum.

3. The semiconductor device of claim 1, wherein said work function adjusting material has a thickness of approximately 1-25 Å.

4. The semiconductor device of claim 1, wherein said metal-containing electrode material of said first gate electrode structure and said first and second metal materials of said second gate electrode structures comprise at least one of titanium and aluminum.

5. The semiconductor device of claim 1, wherein said first transistor is an N-channel transistor.

6. The semiconductor device of claim 1, wherein said conductive barrier material comprises at least one of titanium nitride or aluminum oxide.

\* \* \* \* \*